(12) United States Patent
Guimarães Guerreiro et al.

(10) Patent No.: US 11,950,389 B2
(45) Date of Patent: Apr. 2, 2024

(54) SUBSEA VARIABLE SPEED DRIVE APPARATUS

(71) Applicant: FMC Technologies Do Brasil Ltda., Rio de Janeiro (BR)

(72) Inventors: Ana Maria Guimarães Guerreiro, Rio de Janeiro (BR); Rodrigo Silva Cappato, Uppsala (SE); Anderson Moita Witka, Rio de Janeiro (BR); Lafaete Creomar Lima, Rio de Janeiro (BR); Eduardo Wong Cardoso, Rio de Janeiro (BR); Steven Kronemberger, Petrópolis (BR); Ola Jemtland, Oslo (NO); Ragnar Eretveit, Kongsberg (NO); Stein Følkner, Østerås (NO); Torbjørn Strømsvik, Nesbru (NO)

( * ) Notice: Subject to any disclaimer, the term of this patent is extended or adjusted under 35 U.S.C. 154(b) by 330 days.

(21) Appl. No.: 17/610,432

(22) PCT Filed: May 10, 2019

(86) PCT No.: PCT/BR2019/050175
§ 371 (c)(1),
(2) Date: Nov. 10, 2021

(87) PCT Pub. No.: WO2020/227789
PCT Pub. Date: Nov. 19, 2020

(65) Prior Publication Data
US 2022/0220835 A1   Jul. 14, 2022

(51) Int. Cl.
| | | |
|---|---|---|
| *G06F 1/16* | (2006.01) | |
| *H01L 21/48* | (2006.01) | |
| *H01L 23/367* | (2006.01) | |
| *H01L 23/38* | (2006.01) | |
| *H02K 5/132* | (2006.01) | |

(Continued)

(52) U.S. Cl.
CPC ..... *H05K 7/14337* (2022.08); *H01L 21/4871* (2013.01); *H01L 23/367* (2013.01);
(Continued)

(58) Field of Classification Search
CPC ............. H05K 7/14337; H05K 7/1432; H05K 7/1427; H05K 7/1422; H05K 7/14322;
(Continued)

(56) References Cited

U.S. PATENT DOCUMENTS

| | | | | |
|---|---|---|---|---|
| 7,989,984 B2* | 8/2011 | Draper | ..................... | H02B 7/00 |
| | | | | 307/85 |
| 9,035,739 B2* | 5/2015 | Boe | ..................... | H01H 85/0026 |
| | | | | 337/204 |

(Continued)

FOREIGN PATENT DOCUMENTS

| | | |
|---|---|---|
| EP | 2 958 411 A1 | 12/2015 |
| EP | 2 980 938 A1 | 2/2016 |

(Continued)

*Primary Examiner* — Anthony M Haughton

(57) ABSTRACT

A subsea variable speed drive apparatus comprising a pressure resistant container (90) comprising a curved wall section having a curved, internal surface (90*a*); and a variable speed drive comprising at least one power electronics module (50) arranged inside the container and held at a predetermined ambient pressure. The at least one power electronics module is mounted on a heatsink (40) which is mounted on the internal surface, the heatsink comprising a curved surface (40*b*) contacting the internal surface and having a radius of curvature corresponding to the radius of curvature of the internal surface. A subsea hydrocarbon fluid pumping system comprising such subsea variable speed drive apparatuses and a related method are also disclosed.

17 Claims, 4 Drawing Sheets

(51) Int. Cl.
*H02K 11/33* (2016.01)
*H05K 5/00* (2006.01)
*H05K 7/00* (2006.01)
*H05K 7/14* (2006.01)
*E21B 33/035* (2006.01)
*F04D 13/10* (2006.01)

(52) U.S. Cl.
CPC ............. *H01L 23/38* (2013.01); *H02K 5/132* (2013.01); *H02K 11/33* (2016.01); *E21B 33/0355* (2013.01); *F04D 13/10* (2013.01)

(58) Field of Classification Search
CPC .......... H02K 11/33; H02K 5/132; H02K 5/12; H01L 23/38; H01L 23/367; H01L 23/3675; H01L 21/4871
See application file for complete search history.

(56) References Cited

U.S. PATENT DOCUMENTS

| | | | |
|---|---|---|---|
| 9,439,316 B2 | 9/2016 | Wijekoon et al. | |
| 9,581,358 B2* | 2/2017 | Bushby | F17C 1/007 |
| 10,038,205 B2* | 7/2018 | Wake | H01M 8/04225 |
| 11,575,248 B2* | 2/2023 | Jiang | H02B 1/56 |
| 2010/0084925 A1* | 4/2010 | Draper | H02B 7/00 307/85 |
| 2010/0208415 A1* | 8/2010 | Bo | H01G 9/08 29/25.03 |
| 2013/0175041 A1* | 7/2013 | Nellessen, Jr. | E21B 49/001 429/61 |
| 2015/0216080 A1* | 7/2015 | Chan | F28D 15/02 361/700 |
| 2015/0292304 A1* | 10/2015 | Sneisen | E21B 33/0355 429/7 |
| 2017/0055358 A1* | 2/2017 | Aarskog | H02B 1/28 |
| 2017/0118869 A1* | 4/2017 | Følkner | H05K 7/20336 |
| 2023/0184059 A1* | 6/2023 | Smaadal | H05K 7/14337 166/302 |

FOREIGN PATENT DOCUMENTS

| | | |
|---|---|---|
| WO | WO 2015/121104 A1 | 8/2015 |
| WO | WO 2015/189093 A1 | 12/2015 |

* cited by examiner

SUBSEA VARIABLE SPEED DRIVE APPARATUS

FIELD OF INVENTION

The present invention relates to a subsea variable speed drive (SVSD) apparatus, a hydrocarbon fluid pumping system comprising such an apparatus, a method of producing such an apparatus and a method of operating a subsea hydrocarbon fluid pumping system.

BACKGROUND

The production of oil and gas in a subsea environment normally relies on surface equipment for monitoring, operation control, power supply and other support functions. However, developing solutions so that support equipment works on the seabed, will allow to reduce the impact of weight and space occupied on surface structures, such as platforms, and, consequently, will allow the reduction of operating costs. The benefits are enhanced if one also considers the reduction in demand and simplification of peripheral systems. In the case of a variable speed drive (VSD), such peripheral systems may, for example, include $CO_2$ fire-fighting systems and air conditioning systems.

In mature fields, the use of subsea systems significantly reduces the need for modifications and/or adaptations of platforms that are, as a rule, very old and have their topside already compromised. Often the difficulty of installing a subsea pump lies in the difficulty in making changes topside on the platform, for example to modify the platform to receive the installation of a VSD. Consequently, there are benefits associated with being able to deploy variable speed drives subsea instead of having to install them topside.

There are in principle two options available for installing electronic equipment in a subsea environment. One option is to use so called pressure tolerant electronics, PTEs, in the electronic equipment. This allows the electronic components in the equipment to be exposed to water pressure at the deployment depth. However, there are a number of drawbacks associated with using PTEs. For example, the number of commercially available PTEs is very limited as compared to the number of electronic components rated for atmospheric conditions. Also, the development and qualification processes that PTEs need to be subjected to are very extensive and complicated. The second option is to use electronic components rated for atmospheric conditions and mount the electronic equipment in an enclosure in which atmospheric conditions are maintain. The present invention relates to the latter.

A VSD, sometimes also referred to as a variable frequency drive (VFD), is used in electro-mechanical drive systems to control AC motor speed and torque by varying motor input frequency and/or voltage. A VSD comprises power electronics, often including insulated-gate bipolar transistors (IGBT), to produce the desired input frequency and voltage. In hydrocarbon production systems, motors operating pumps and compressors are often controlled using VSD technology.

A problem associated with mounting VSD components in a confined subsea enclosure is managing the thermal conditions inside the enclosure. The power electronics of a VSD produces thermal energy and this thermal energy must be dissipated by the walls of the enclosure in order to avoid damaging the electronic components of the VSD. The present invention addresses this problem and provides means for dissipating the thermal energy generated by the electronic components of the VSD.

SUMMARY OF THE INVENTION

According to a first example aspect, the present invention provides a subsea variable speed drive (SVSD) apparatus comprising a pressure resistant container comprising a curved wall section having a curved, internal surface; and a variable speed drive (VSD) comprising at least one power electronics module arranged inside the container and held at a predetermined ambient pressure. The at least one power electronics module is mounted on a heatsink which is mounted on the internal surface, the heatsink comprising a curved surface contacting the internal surface and having a radius of curvature corresponding to the radius of curvature of the internal surface. The heatsink may be fixedly attached, e.g. bolted, to the internal surface allowing sufficient contact pressure to be created between the heatsink and the internal surface to provide efficient heat transfer from the heatsink to the container.

Said predetermined ambient pressure, i.e. the pressure at which the at least one power electronics module is held within the pressure resistant container, may be within the range of 0.5 atm to 1.5 atm, within the range of 0.9 atm to 1.1 atm, or 1.0 atm. The pressure resistant container is configured to uphold this internal pressure while resisting the external pressure at the depth the SVSD apparatus is configured to be deployed, which deployment depth may be 3000 m. The pressure resistant container may be cylindrical. The container may be fully or partially filled with nitrogen gas, $N_2$, at said ambient pressure.

The heatsink provides an efficient transfer of thermal energy from the power electronics module to the container, thus allowing thermal energy to be efficiently dissipated by seawater surrounding the container. This allows conventional electronic components configured for operation in normal atmospheric conditions, i.e. at a pressure of approximately 1.0 atm, to be used in the VSD, thus avoiding extensive qualification procedures necessary for specialized electronic components, such as pressure tolerant electronics. Thus, it provides for a cost-efficient production of a SVSD apparatus since standard electronic components rated for atmospheric use and having a proven track record can easily be found in the electronics market.

The heatsink may be of any one of a copper alloy or an aluminium alloy.

The at least one power electronics module may be mounted directly onto the heatsink. Thermal paste may be provided between the power electronics module and the heatsink. The at least one power electronics module may have a planar surface contacting a planar surface of the heatsink.

Alternatively, a Peltier element may be mounted onto the heatsink and the at least one power electronics module may be mounted onto the Peltier element. Thermal paste may be provided between the Peltier element and the at least one of the power electronics module and/or the heatsink.

Said VSD may comprise power arms, wherein each power arm may comprise at least one of said at least one power electronics module. The VSD may also comprise a control unit configured to supply power to and control the power arms. In the pressure resistant container, the control unit may be positioned below the power arms. The VSD may comprise three power arms and, in a cylindrical configuration of the pressure resistant container, the three power arms may be positioned symmetrically about the inner side wall of the container, thus allowing the at least one power electronics module of each power arm easy access to a heatsink to be mounted onto the same. The control unit may be positioned below the power arms. Said at least one power electronics module may comprise an insulated-gate bipolar transistor (IGBT). The IGBT may have a multilevel neutral point clamped (NPC) inverter topology.

The SVSD apparatus may comprise one or a plurality of electrical penetrators configured to allow electrical power to be fed to the VSD through the pressure resistant container, e.g. from a topside or a subsea transformer, and configured to allow electrical power to be fed from the VSD through the pressure resistant container to an electric motor, e.g. positioned at a subsea location. The SVSD apparatus may also comprise one or a plurality of penetrators configured to allow control signals to be fed to and/or from the VSD through the pressure resistant container, e.g. to and/or from a topside controller. The SVSD apparatus may comprise an output filter reactor configured to decrease harmonics created in the VSD. The output filter reactor may be located in the upper part of the pressure resistant container. An internal wall may be arranged inside the pressure resistant container dividing the volume defined by the pressure resistant container into a first compartment holding the control unit and the power arms and a second compartment holding the output filter reactor. The second compartment may be filled with oil and the first compartment may be filled with nitrogen gas ($N_2$).

The first example aspect of the invention provides efficient passive cooling of the SVSD apparatus and allows for the production of a small size and low weight SVSD apparatus. Within the context of this application, passive cooling refers to cooling not relying on a fluid circulating within and/or through the apparatus to remove excess heat. Consequently, utilising a heatsink according to the invention for cooling the apparatus, piping, ducts, pumps and other features necessary for circulating a cooling fluid in the apparatus can be obviated, thus allowing for a smaller and lighter SVSD apparatus as compared to prior art SVSD apparatuses.

According to a second example aspect, the present invention provides a subsea hydrocarbon fluid pumping system comprising at least one electric motor positioned at a subsea location and a plurality of the subsea variable speed drive apparatuses, the plurality of subsea variable speed drive apparatuses being configured to drive the at least on motor in parallel.

This will provide a subsea hydrocarbon fluid pumping system having intrinsic redundancy. Since drive capacity can be regulated by the number of SVSD apparatuses arranged in parallel, the size and weight of individual SVSD apparatuses can be reduced. This will allow smaller vessels to be used during deployment of the SVSD apparatuses. Also, it will allow for modularization and standardization of the SVSD apparatuses, leading to low cost and lead time. Furthermore, it allows SVSD apparatuses to be easily added to or removed from to the system should the drive capacity have to be changed. This will allow investment in production projects to be reduced, making economically feasible production expansion projects that previously would not have been possible due to lack of available space on mature platforms.

According to third example aspect, the present invention provides a method of producing a subsea variable speed drive apparatus comprising a pressure resistant container configured to hold atmospheric pressure comprising a curved wall section having a curved, internal surface; and a variable speed drive comprising at least one power electronics module arranged inside the container, which method comprises the steps of mounting a heatsink comprising a curved surface having a radius of curvature corresponding to the radius of curvature of the internal surface on the internal surface so that the curved surface contacts the internal surface; and mounting the at least one power electronics module on the heatsink.

The step of mounting the at least one power electronics module on the heatsink may comprise mounting the at least one power electronics module directly onto the heatsink.

The at least one power electronics module and the heatsink have respective planar surfaces, and the step of mounting the at least one power electronics module directly onto the heatsink may comprise mounting the at least one power electronics module onto the heatsink so that the planar surface of the at least one power electronics module contacts the planar surface of the heatsink.

Alternatively, the step of mounting the at least one power electronics module on the heatsink may comprise the steps of mounting a Peltier element on the heatsink; and mounting the at least one power electronics module on the Peltier element.

The method of producing the subsea variable speed drive apparatus may comprise the steps of filling at least a section of the container holding the at least one power electronics module with nitrogen gas to a predetermined pressure; and, after said step of filling the section of the container holding the at least one power electronics module with nitrogen gas, sealing the container.

The step of filling at least the section of the container holding the at least one power electronics module with nitrogen gas may comprise filling the nitrogen gas to a pressure of any one of: within a range of 0.5 atm to 1.5 atm, within a range of 0.9 atm to 1.1 atm, and 1.0 atm, e.g. atmospheric pressure or near atmospheric pressure.

The at least one electric motor may be arranged to drive a pump or a compressor in the subsea hydrocarbon fluid pumping system.

According to fourth example aspect, the present invention provides a method of operating a subsea hydrocarbon fluid pumping system comprising at least one electric motor positioned at a subsea location and a plurality of subsea variable speed drive apparatuses produced according to the third example aspect, comprising the steps of deploying the plurality of subsea variable speed drive apparatuses subsea in a parallel configuration; and driving the at least one electric motor in parallel from the plurality of subsea variable speed drive apparatuses.

BRIEF DESCRIPTION OF THE FIGURES

The present invention will in the following be described in more detail with reference to the accompanying drawings, which serve only to illustrate preferred embodiments of the invention without thereby implying limitations or restrictions on its scope.

DETAILED DESCRIPTION OF THE INVENTION

Figure 1:
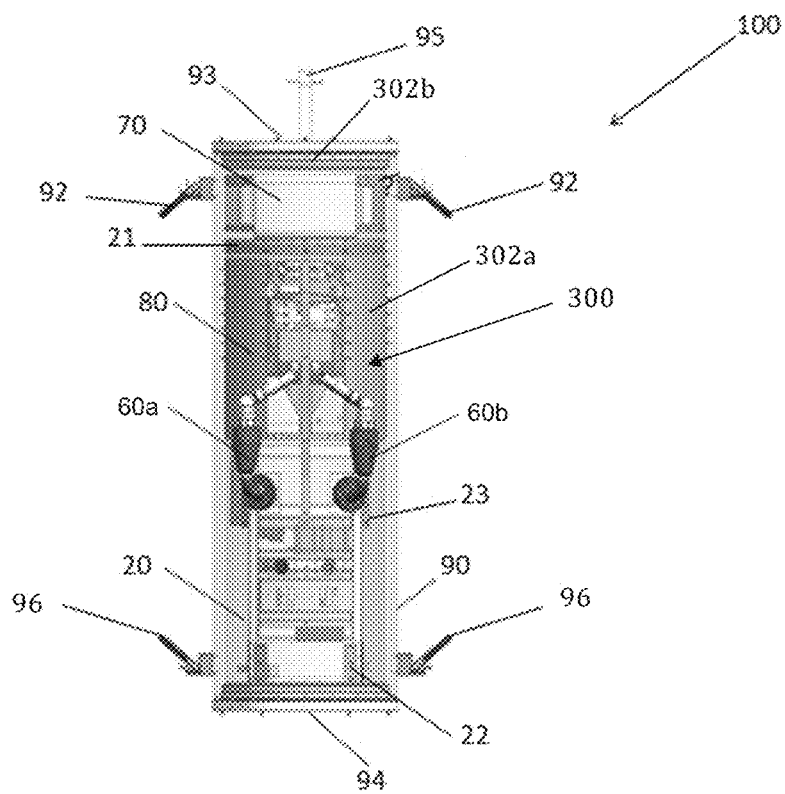
FIG. 1 illustrates a subsea variable speed drive (SVSD) apparatus of the present invention in one of its possible embodiments with some of its internal components.

FIG. 1 discloses a subsea variable speed drive (SVSD) apparatus 100 according to one embodiment of the invention. The apparatus 100 comprises a variable speed drive (VSD) 300 configured to drive a motor of a subsea pump or compressor in a subsea hydrocarbon fluid pumping system. The apparatus 100 comprises a pressure resistant enclosure or container 90 holding electronic components of the VSD 300 at atmospheric pressure. The container 90 may have the form of a shell or a canister. Within the container 90, the electronic components are positioned to facilitate dissipation of heat generated during the operation of the VSD 300.

Typically, the VSD 300 may have a maximum rated power of up to 2.0 MVA, a maximum output voltage of about 4.6 kV, a maximum output current of about 250 A, and a maximum working frequency of about 120 Hz. However, these specifications may vary, being limited only by the challenges of heat dissipation due to the thickness of the wall of the container 90. The container 90 may be dimensioned for operating at a water depth of up to 3000 meters. The SVSD apparatus 100 may have preferred dimensions of approximately 3.37 m in height, 1.16 m in diameter and its interior may be filled with nitrogen gas ($N_2$) to a predetermined pressure allowing conventional, non-PTE rated electronics to be used. Such a predetermined pressure may for example be within the range of 0.5 atm to 1.5 atm, within the range of 0.9 atm to 1.1 atm, or 1.0 atm, i.e. atmospheric or near atmospheric pressure.

If a greater load is required for the pumping system, as in the case of the pumping systems found in the Libra fields in the Campos Basin—Brazil, a plurality of SVSD apparatuses 100 comprising a VSD may be arranged in parallel. At a system level, this increases system reliability since a parallel arrangement provides intrinsic redundancy and allows production interruptions due to VSD failure to be avoided.

The multilevel inverter topology selected for the VSD 300 of the apparatus 100 according to the present invention is preferably the Neutral Point Clamped (NPC) because it has a simpler circuit structure, with fewer components and a more compact structure than other architectures. In this architecture, the VSD 300 can be of 6, 12 or 18 pulses.

The container 90 may preferably be cylindrical and provided with a first, lower sealing cap 94 at its lower end, and a second, upper sealing cap 93 at its upper end. Metallic and polymeric seals (not shown) may be used between the sealing caps 93 and 94 and the container 90.

The upper sealing cap 93 comprises a lifting device 95 welded to its central region. At its upper end, the container 90 further has two diametrically opposed lifting points 92, and at the lower end two equally diametrically parallel lifting points 96. These lifting points 92 and 96 are used for handling the apparatus 100.

In a preferred embodiment, the wall of the container (90) may comprise a thickness between 25.4 mm (1 in) and 127 mm (5 in). The wall thickness of the container 90 is an important variable to be considered during the thermal design and it is desirable to be as thin as possible while still being able to withstand the external pressure at the deployment depth. The container 90 may be made from carbon steel.

The VSD 300 comprises a preferably rectangularly shaped control unit 20 which is secured internally to the container 90 by fixtures 22. Above the control unit 20, power arms 80 are positioned secured to the unit 20 and to the inner wall of the container 90 by fixtures 23, adjacent the inner wall 90a of the container 90.

Preferably, three power arms 80 are disposed spaced symmetrically from one to another, thus to optimize the heat dissipation generated by the electronic equipment. However, the number of power arms 80 may vary with the use of another architecture or other rated power.

Equipment in the control unit 20 is responsible for supplying power to the power arms 80 and controlling the power arms 80 system and communications. In the control unit 20 are distributed various electronic boards responsible for topside 109 communication via an umbilical 200 (see FIG. 7). The control unit 20 is connected to the power arms by control and electrical cables (not shown).

Depending on the distance between the SVSD apparatus 100 and the motor the VSD 300 is to control, an output filter reactor 70 may be used to decrease the harmonics due to the architecture of the VSD 300. The output filter 70 is an important part in a system where SVSD apparatuses are arranged in a parallel configuration. In the disclosed embodiment, the output filter reactor 70 is located in the upper part of the container but it can alternatively be positioned in the lower part thereof. In alternative embodiments, however, the output filter reactor may be positioned outside of the container 90, e.g. in an apparatus of its own (not shown) separate from the apparatus 100.

Figure 7:
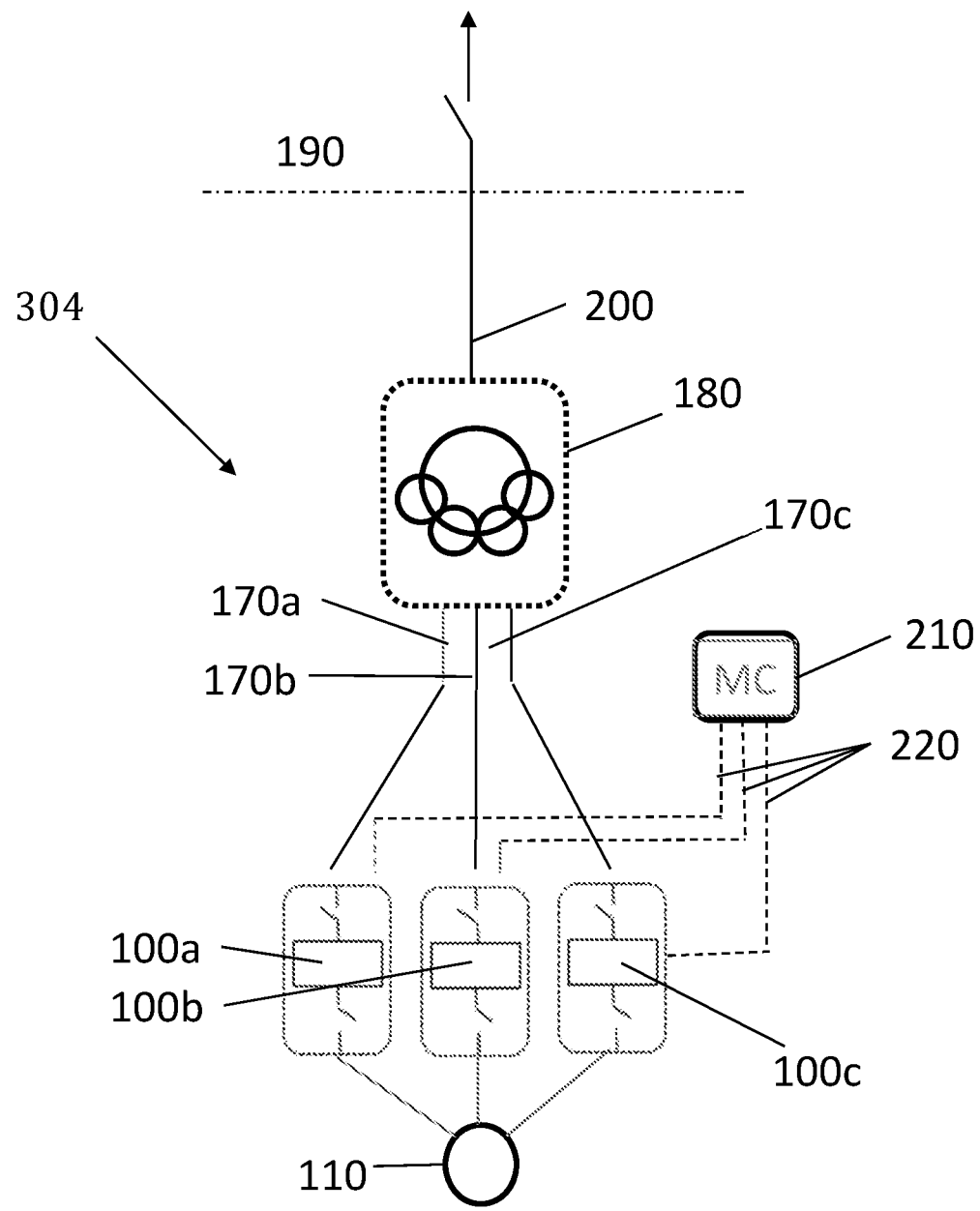
FIG. 7 shows an embodiment of the present invention in which three SVSDs of the present invention are connected in parallel.

The apparatus 100 comprises two electrical penetrators 60a, 60b arranged at the central region of the apparatus 100 to feed electrical power from a topside or a subsea transformer 180 to the VSD 300 and from the VSD 300 the subsea motor 110 (see FIG. 7). The apparatus 100 also comprises one or a plurality of penetrators (not shown) for control conduits conveying control signals from the topside 190 to the VSD 300.

Figure 2:
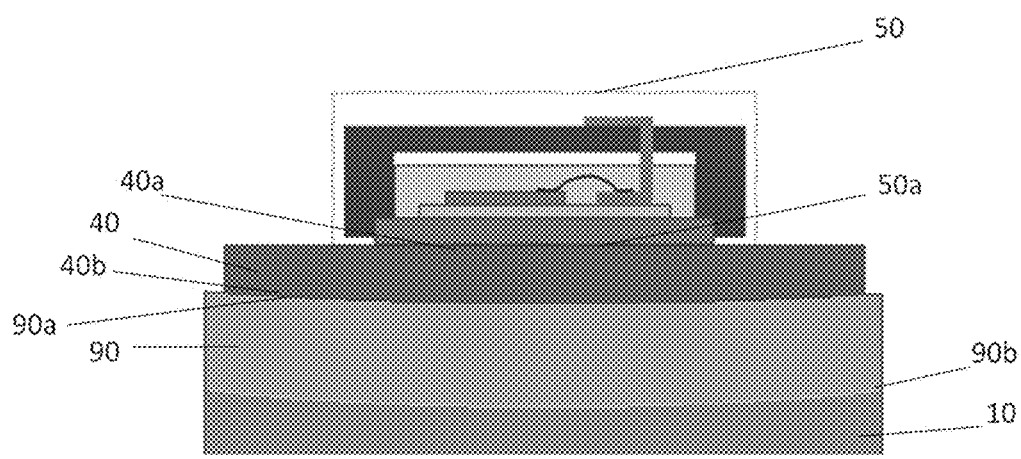
FIG. 2 schematically illustrates an insulated-gate bipolar transistor (IGBT) module coupled to a heatsink which is mounted to a container which is in contact with seawater.

The power arms 80 of the VSD 300 comprise power semiconductors in the form of insulated-gate bipolar transistor (IGBT) modules 50 (see FIG. 2). The IGBT modules 50 are the main heat sources in the SVSD apparatus 100. Correct operation of IGBT modules 50 requires the temperature within the container 90 to be kept within a nominal range. Therefore, thermal aspects must be carefully considered when designing the apparatus 100 and one of the major challenges associated with the SVSD apparatus 100 according to the present invention is related to the management of internal temperature control due to the high heat dissipation from the electronic devices, in particular power electronics of the power arms 80.

In the present embodiment, each power arm 80 comprises 5 IGBT modules 50. Each IGBT module 50 is mounted on a heatsink 40 (see FIG. 2). The IGBT module 50 comprises a planar, i.e. flat, base 50a. The heatsink 40 comprises a corresponding planar, i.e. flat, surface 40a and the IGBT module 50 is disposed with its flat base 50a coupled to the flat surface 40a of the heatsink 40. The heatsink 40 comprises a curved surface 40b contacting an internal surface 90a of the container 90. The curved surface 40a has a radius of curvature corresponding to the radius of curvature of the internal surface 90a. Consequently, if the container 90 is cylindrical, as may be preferred, the opposing curved surface 40b of the heatsink 40 will have the same diameter as the inner wall 90a of the canister 90, so that the contact between these two surfaces is optimal, maximizing the heat conduction. Further, the heat sink material 40 is preferably copper or aluminium alloys. Further, thermal paste may be applied between the base 50a of the IGBT module 50 and surface 40a of the heatsink 40, and between the heatsink 40 and the inner wall 90a of the container 90 to decrease the contact resistance between these surfaces.

FIG. 2 shows a IGBT module 50 having a planar surface 50a contacting a planar surface 40a of the heatsink 40, which in turn has a curved base 40b contacting the curved inner surface 90a of the container 90. At the point of contact between the curved base 40b and the inner surface 90a, the curvature of the inner surface 90a is the same as the curvature of the curved base 40b ensuring efficient transport of thermal energy from the IGBT module 50 to the container 90. The container 90 has its outer surface 90b in contact with seawater 10.

Peltier modules may be used to increase the thermal dissipation capability of the container 90. Peltier modules may be introduced between the IGBT module 50 and the heatsink 40, or in the portion in the wall of the container 90, stimulating thermal conduction from the IGBT module 50 to the heatsink 40 and from the heatsink 40 to the container 90, respectively.

By combining a suitable combination of material and shape of the heatsink 40, the heatsink can be designed to dissipate the thermal energy generated by the IGBT modules 50 so that the temperature inside the container 90 is kept with the range specified as allowable for the VSD electronics, including the junction temperature of the IGBT modules.

An internal wall 21 may be arranged inside the container 90 dividing the volume defined by the container 90 into a first compartment 302a holding the control unit 20 and the power arms 80 and a second compartment 302b holding the output filter reactor 70. The wall 21 may be of a thermally insulating material preventing thermal energy generated by the output filter reactor 70 from dissipating into the first compartment 302a. The compartment holding the output filter reactor 70, i.e. the second compartment 302b in FIG. 1, may be filled with oil to facilitate dissipation of thermal energy generated by the output filter reactor 70 through the container wall surrounding the second compartment 302b. Consequently, in one embodiment the compartment housing the output filter 70 may be filled with oil and the compartment 302a housing the control unit 20 and the power arms 80 and associated power electronics, e.g. IGBT modules 50, may be filled with nitrogen gas ($N_2$) at approximately 1 atmosphere.

Figure 3:
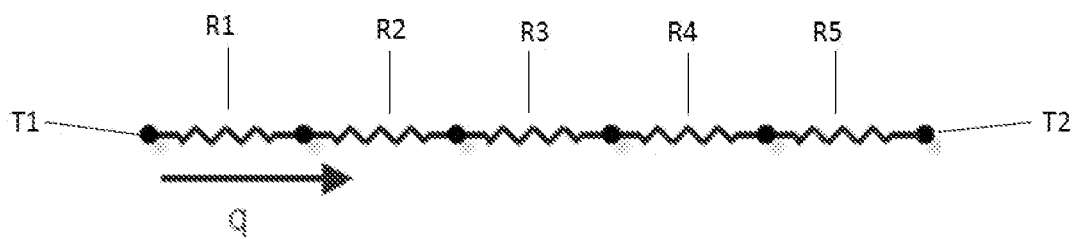
FIG. 3 illustrates a thermal circuit of one embodiment of the present invention, representing thermal resistances in series with a heat dissipation system.

FIG. 3 shows a thermal circuit representing thermal resistances between the IGBT module 50 and the sea water surrounding the container 90, where T1 is the first variable representing the temperature at the base 50a of the IGBT module 50, following the sequence R1, R2, R3, R4, R5 and T2, wherein R1 is the contact resistance between the base 50a of the IGBT module 50 and the flat surface 40a of the heatsink 40, R2 is the conductivity resistance of the heatsink 40, which may be considered a linear conduction, R3 is the contact resistance between the heatsink base 40b and the inner surface 90a of the canister 90 of the SVSD apparatus 100, R4 is the resistance in the conduction of the canister 90 where a radial conduction is considered, R5 is the last resistance of the natural convection of seawater 10 and an outer surface 90b of the container 90. T2 is the water temperature around the SVSD apparatus 100, which is approximately 4° C. for deep water and 15° C. for shallower water. The heat flow (q) represents the heat transferred from the base 50a of the IGBT module 50 to the seawater 10.

Figure 4:
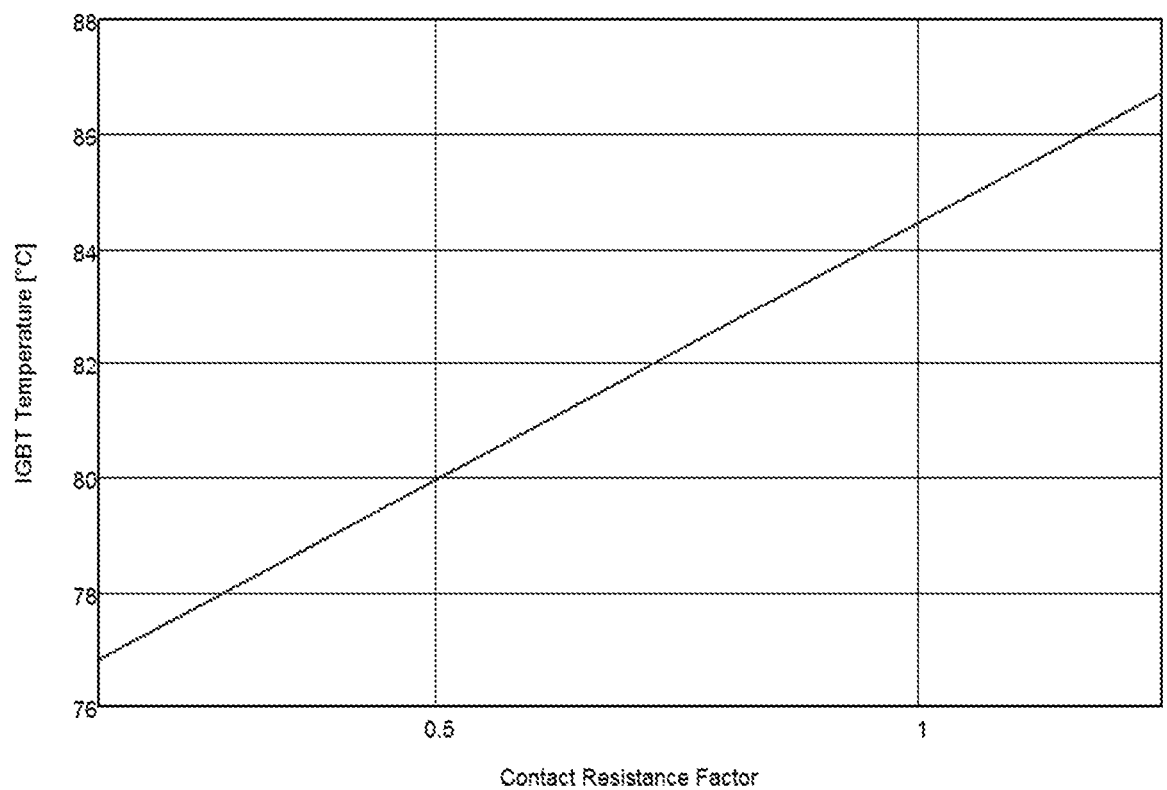
FIG. 4 illustrates a graph of a IGBT (A) temperature versus contact resistance between the heatsink and the enclosure wall.
Figure 5:
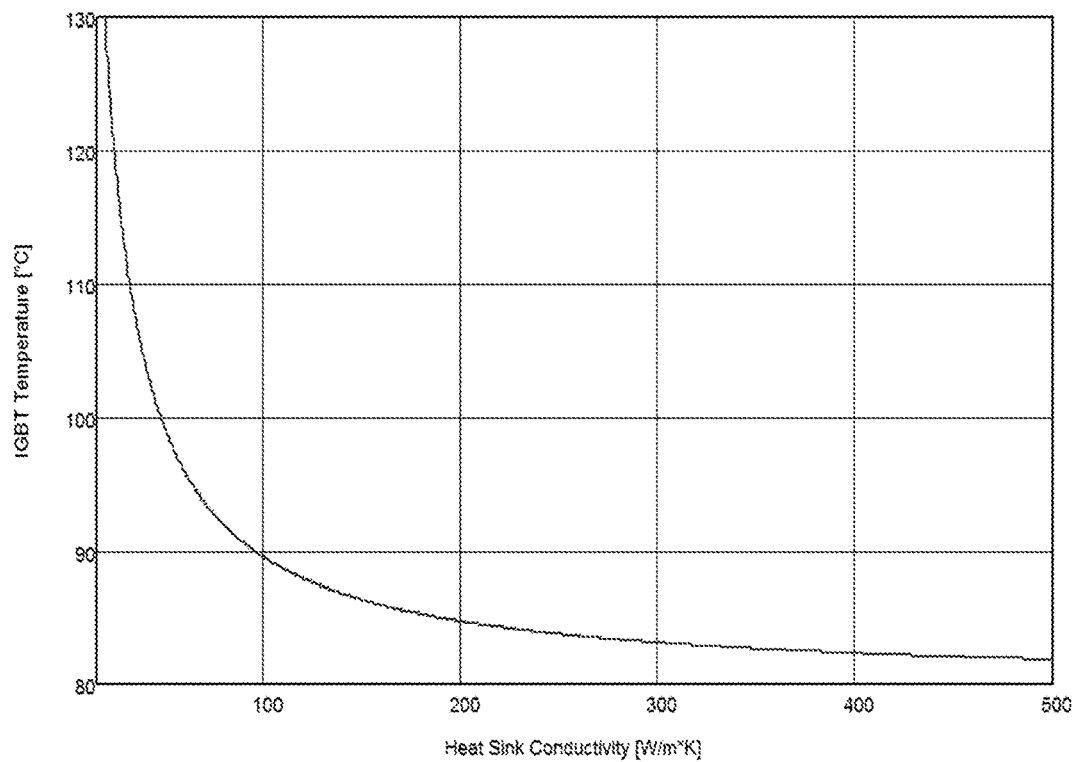
FIG. 5 illustrates a graph of the IGBT temperature (A) versus conductivity of the heatsink material (D)
Figure 6:
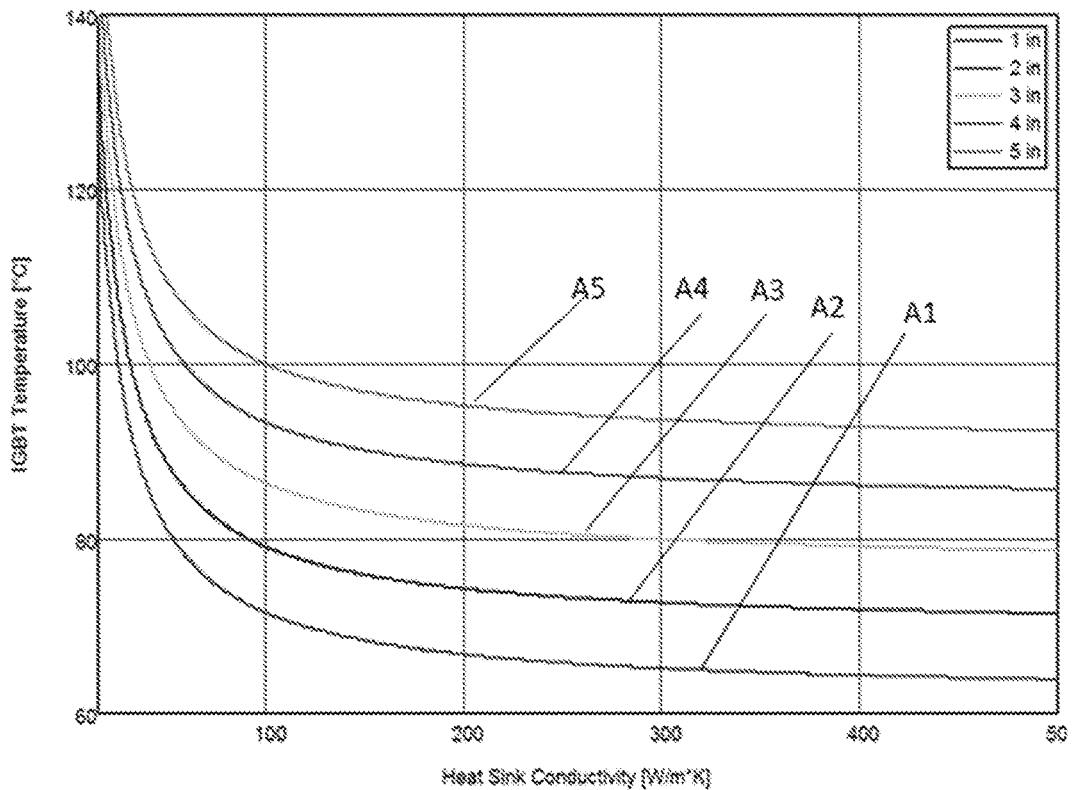
FIG. 6 illustrates a graph of the IGBT (A) temperature versus heatsink material (D) conductivity for different wall thicknesses of the enclosure (SVSD enclosure)

The graphics shown in FIGS. 4, 5 and 6 demonstrate relationships that may be evaluated during the thermal design of the apparatus 100. T1 in the curves is the temperature at the base of the IGBT module 50a, i.e. between the IGBT module 50 and the surface 40a of the heatsink 40.

FIG. 4 correlates the temperature of the IGBT 50 with the contact resistance R3 between the heatsink 40 and the wall of the container 90 when it is increased or decreased. These variables are inversely proportional. The contact resistance factor is a factor that is multiplied by the contact resistance R3 of the design. When it is low, there is less resistance and a better heat dissipation, thus resulting in lower IGBTs temperatures.

FIG. 5 correlates the temperature of the IGBT module 50 with the conductivity of the heatsink material 40. As is evident from the figure, there is not much to gain by using materials with higher conductivity than approximately 300 W/mK.

FIG. 6 correlates the temperature of the IGBT module 50 with the conductivity of the heatsink material 40 for different wall thicknesses of the container 90, where A1 represents the thickness of 1 in. (25.4 mm), A2 represents the thickness of 50.8 mm (2 in), A3 represents the thickness of 76.2 mm (3 in), A4 represents the thickness of 101.6 mm (4 in) and A5 represents the thickness of 127 mm (5 in). The wall thickness of the container 90 is an important variable to be considered during the thermal design of the apparatus 100 and it is desirable that the wall thickness is as thin as possible.

FIG. 7 illustrates a subsea hydrocarbon fluid pumping system 304 comprising a plurality of SVSD apparatuses of the above-discussed type, i.e. SVSD apparatuses comprising a VSD having IGBT modules 50 thermally connected to the inside wall of the apparatus container 90 via a heatsink 40 which is mounted on the internal surface 90a of the container 90, the heatsink 40 comprising a curved surface 40b contacting the internal surface 90a and having a radius of curvature corresponding to the radius of curvature of the internal surface 90a (see FIG. 2). The system comprises an umbilical 200 running from a topside location 190, e.g. a platform, to a transformer 180 positioned on the seabed. Three subsea power connectors 170a, 170b and 170c run from the transformer 180 to three SVSD apparatuses 100a, 100b, 100c disposed in parallel. The apparatuses 100a, 100b and 100c are connected to a subsea pump motor 110. A master control (MC) 210 connected to the apparatuses 100a, 100b, 100c via control signal conduits 220 is arranged to synchronize parallel operation of the SVSD apparatuses 100a, 100b, 100c.

By arranging the SVSD apparatuses in a parallel configuration, intrinsic redundancy is obtained providing a reliable system. In particular, operation of the system will not be dependent on one SVSD apparatus as the system can keep on operating even if one of the SVSD apparatuses malfunctions.

Also, the parallel configuration confers flexibility to the system since the number of SVSD apparatuses in parallel can be adapted to individual systems and also to changing pumping requirements in a system. This allows for modularization and standardization of the SVSD apparatuses, leading to low cost and lead time.

In addition, the invention represents great opportunities to reduce investment in production projects, the use of subsea systems can economically make feasible production expansion projects that previously would not be feasible with conventional systems due to limitations on mature platforms.

Above, the present invention has been disclosed with reference to specific embodiments and examples. However, various modifications and variations of the illustrative embodiments, as well as other embodiments of the invention, which are apparent to person skilled in the art to which the disclosed subject-matter pertains, may lie within the scope of the present invention as defined by the following claims.

The invention claimed is:

1. A subsea variable speed drive apparatus comprising:
   a pressure resistant container comprising a curved wall section having a curved internal surface; and
   a variable speed drive comprising at least one power electronics module arranged inside the container and held at a predetermined atmospheric pressure;
   wherein the at least one power electronics module is mounted on a heatsink mounted on the internal surface, the heatsink comprising a curved surface contacting the internal surface and having a radius of curvature corresponding to a radius of curvature of the internal surface, the heatsink being fixedly attached to the internal surface so as to create a contact pressure between the heatsink and the internal surface, thereby providing efficient heat transfer from the heatsink to the container.

2. The subsea variable speed drive apparatus according to claim 1, wherein the heatsink is bolted onto the internal surface.

3. The subsea variable speed drive apparatus according to claim 1, wherein said at least one power electronics module comprises an insulated-gate bipolar transistor.

4. The subsea variable speed drive apparatus according to claim 1, wherein the at least one power electronics module is mounted directly onto the heatsink.

5. The subsea variable speed drive apparatus according to claim 4, wherein the at least one power electronics module has a planar surface contacting a planar surface of the heatsink.

6. The subsea variable speed drive apparatus according to claim 1, wherein a Peltier element is mounted on the heatsink and the at least one power electronics module is mounted on the Peltier element.

7. The subsea variable speed drive apparatus according to claim 1, wherein the variable speed drive comprises a control unit configured to supply power to and control the at least one power electronics module, the control unit being located below the at least one power electronics module when the subsea variable speed drive apparatus is deployed in a subsea position.

8. The subsea variable speed drive apparatus according to claim 1, wherein said predetermined atmospheric pressure is within a range of 0.5 atm to 1.5 atm, or within a range of 0.9 atm to 1.1 atm, or 1.0 atm.

9. A subsea hydrocarbon fluid pumping system comprising at least one electric motor positioned at a subsea location and a plurality of subsea variable speed drive apparatuses according to claim 1, wherein the plurality of subsea variable speed drive apparatuses are configured to drive the at least one motor in parallel.

10. A method of producing a subsea variable speed drive apparatus comprising a pressure resistant container configured to hold atmospheric pressure, the container comprising a curved wall section having a curved internal surface, and a variable speed drive comprising at least one power electronics module arranged inside the container, the method comprising the steps of:
   mounting a heatsink comprising a curved surface having a radius of curvature corresponding to a radius of curvature of the internal surface so that the curved surface contacts the internal surface; and
   mounting the at least one power electronics module on the heatsink;
   wherein said step of mounting the heatsink on the internal surface comprises fixedly attaching the heatsink to the internal surface so as to create a contact pressure between the heatsink and the internal surface to thereby provide efficient heat transfer from the heatsink to the container.

11. The method according to claim 10, wherein the step of mounting the heatsink on the internal surface comprises bolting the heatsink onto the internal surface.

12. The method according to claim 10, wherein the step of mounting the at least one power electronics module on the heatsink comprises mounting the at least one power electronics module directly onto the heatsink.

13. The method according to claim 12, wherein the at least one power electronics module and the heatsink have respective planar surfaces, and wherein the step of mounting the at least one power electronics module directly onto the heatsink comprises mounting the at least one power electronics module onto the heatsink so that the planar surface of the at least one power electronics module contacts the planar surface of the heatsink.

14. The method according to claim 10, wherein the step of mounting the at least one power electronics module on the heatsink comprises the steps of:
   mounting a Peltier element on the heatsink; and
   mounting the at least one power electronics module on the Peltier element.

15. The method according to claim 10, comprising the steps of:
   filling at least a section of the container holding the at least one power electronics module with nitrogen gas to a predetermined pressure; and
   after said step of filling the section of the container holding the at least one power electronics module with nitrogen gas, sealing the container.

16. The method according to claim 15, wherein the step of filling at least the section of the container holding the at least one power electronics module with nitrogen gas to a predetermined pressure comprises filling the nitrogen gas to a pressure within a range of 0.5 atm to 1.5 atm, or within a range of 0.9 atm to 1.1 atm, or of 1.0 atm.

17. A method of operating a subsea hydrocarbon fluid pumping system comprising at least one electric motor positioned at a subsea location and a plurality of subsea variable speed drive apparatuses produced according to claim 10, the method comprising the steps of:
   deploying the plurality of subsea variable speed drive apparatuses subsea in a parallel configuration; and
   driving the at least one electric motor in parallel from the plurality of subsea variable speed drive apparatuses.

* * * * *